(12) United States Patent
Tamiya et al.

(10) Patent No.: US 8,344,262 B2
(45) Date of Patent: Jan. 1, 2013

(54) EPOXY RESIN COMPOSITION FOR PRINTED WIRING BOARD, RESIN COMPOSITION VARNISH, PREPREG, METAL CLAD LAMINATE, PRINTED WIRING BOARD AND MULTILAYER PRINTED WIRING BOARD

(75) Inventors: Hiroki Tamiya, Koriyama (JP); Yoshihiko Nakamura, Sukagawa (JP); Shunji Araki, Koriyama (JP); Eiji Imaizumi, Tamura-gun (JP); Kentarou Fujino, Koriyama (JP); Tomoaki Sawada, Koriyama (JP); Takashi Shinpo, Koriyama (JP)

(73) Assignee: Panasonic Corporation, Osaka (JP)

( * ) Notice: Subject to any disclaimer, the term of this patent is extended or adjusted under 35 U.S.C. 154(b) by 575 days.

(21) Appl. No.: 12/441,422

(22) PCT Filed: Sep. 14, 2006

(86) PCT No.: PCT/JP2006/318265
§ 371 (c)(1),
(2), (4) Date: Mar. 16, 2009

(87) PCT Pub. No.: WO2008/032383
PCT Pub. Date: Mar. 20, 2008

(65) Prior Publication Data
US 2010/0025094 A1 Feb. 4, 2010

(51) Int. Cl.
*H05K 1/00* (2006.01)
*B32B 27/38* (2006.01)
*C08K 5/00* (2006.01)
*C08L 63/00* (2006.01)

(52) U.S. Cl. ........ 174/258; 428/413; 428/414; 523/461; 523/466

(58) Field of Classification Search .......... 174/258, 174/259; 428/297.4, 413–418, 901; 525/109, 525/396; 523/466, 461
See application file for complete search history.

(56) References Cited

U.S. PATENT DOCUMENTS

| | | | | |
|---|---|---|---|---|
| 5,001,174 A * | 3/1991 | Yanagisawa et al. | ......... | 523/443 |
| 5,049,435 A * | 9/1991 | Uno et al. | ...... | 428/209 |
| 5,258,522 A * | 11/1993 | Tsuchida et al. | ....... | 548/110 |
| 5,731,370 A * | 3/1998 | Shiobara et al. | ....... | 523/466 |
| 5,806,177 A * | 9/1998 | Hosomi et al. | ....... | 29/846 |
| 5,945,222 A * | 8/1999 | Nagase et al. | ....... | 428/416 |
| 6,117,536 A * | 9/2000 | Poutasse | ....... | 428/301.1 |
| 6,132,589 A * | 10/2000 | Ameen et al. | ....... | 205/177 |
| 6,214,455 B1 * | 4/2001 | Honda et al. | ....... | 428/299.4 |
| 6,432,541 B1 * | 8/2002 | Gan | ....... | 428/416 |
| 6,462,147 B1 * | 10/2002 | Arata et al. | ....... | 525/486 |
| 6,620,510 B1 * | 9/2003 | Taguchi et al. | ....... | 428/413 |
| 6,645,630 B1 * | 11/2003 | Nakamura et al. | ....... | 428/413 |
| 2003/0099839 A1 * | 5/2003 | Hwang et al. | ....... | 428/413 |
| 2004/0019134 A1 * | 1/2004 | Hwang et al. | ....... | 523/400 |
| 2004/0161612 A1 * | 8/2004 | Takanezawa et al. | ....... | 428/414 |
| 2004/0166324 A1 * | 8/2004 | Mishima et al. | ....... | 428/413 |
| 2004/0247881 A1 * | 12/2004 | Dean et al. | ....... | 428/413 |
| 2004/0258921 A1 * | 12/2004 | Watanabe et al. | ....... | 428/413 |
| 2005/0008868 A1 * | 1/2005 | Nakamura et al. | ....... | 428/414 |
| 2005/0014035 A1 * | 1/2005 | Nakagiri et al. | ....... | 428/901 |
| 2005/0054776 A1 * | 3/2005 | Itou et al. | ....... | 525/191 |
| 2005/0069715 A1 * | 3/2005 | Hayakawa et al. | ....... | 428/413 |
| 2005/0121229 A1 * | 6/2005 | Takai et al. | ....... | 174/261 |
| 2007/0123681 A1 * | 5/2007 | Kobayashi et al. | ....... | 528/38 |
| 2007/0202255 A1 * | 8/2007 | Shinoda et al. | ....... | 427/255.6 |

FOREIGN PATENT DOCUMENTS

| | | |
|---|---|---|
| JP | 8-151507 | 6/1996 |
| JP | 09012683 A * | 1/1997 |
| JP | 9-316178 | 12/1997 |
| JP | 2000297094 A * | 10/2000 |
| JP | 2001-187836 | 7/2001 |
| JP | 2002-223048 | 8/2002 |
| JP | 2003-147166 | 5/2003 |
| JP | 2003-334886 | 11/2003 |
| JP | 2004-115634 | 4/2004 |
| JP | 2000-63545 | 2/2005 |

OTHER PUBLICATIONS

Machine Translation of JP 09012683 A: Epoxy Resin Composition Containing imidazole siliane as; Jan. 1997.*
Machine Translation of JP 2000297094 A: New Organosilicon Compound, Its Production and Surface; Oct. 2000.*
Extended European Search Report dated Dec. 22, 2010 that issued with respect to counterpart European Patent Application No. 06797977.3.
Database WPI, Week 200171, Thomson Scientific, London, GB; AN 2001-613430, XP002613671, dated Dec. 16, 2010.
Database WPI, Week 199808, Thomson Scientific, London, GB; AN 1998-082719, XP002613672, dated Dec. 16, 2010.

* cited by examiner

*Primary Examiner* — Timothy J. Thompson
*Assistant Examiner* — Sherman Ng
(74) *Attorney, Agent, or Firm* — Greenblum & Bernstein, P.L.C.

(57) ABSTRACT

An epoxy resin composition for printed wiring board, characterized by containing (A) an epoxy resin component containing an epoxy resin (A-1) having nitrogen and bromine atoms in the same molecule, (B) a phenolic curing agent component containing a phenol resin (B-1), and (C) a curing accelerator component containing an imidazole-silane compound (C-1).

19 Claims, No Drawings

EPOXY RESIN COMPOSITION FOR PRINTED WIRING BOARD, RESIN COMPOSITION VARNISH, PREPREG, METAL CLAD LAMINATE, PRINTED WIRING BOARD AND MULTILAYER PRINTED WIRING BOARD

TECHNICAL FIELD

The present invention relates to an epoxy resin composition, a prepreg, a metal clad laminate and a printed wiring board used as materials for printed wiring boards and a multilayer printed wiring board produced by using these materials.

BACKGROUND ART

Epoxy resin composition-containing prepregs have been known as the adhesive materials used in production of printed wiring boards. Such a prepreg is produced by impregnating a substrate such as glass cloth with a varnish of epoxy resin composition and drying the resulting substrate.

And, a printed wiring board is produced by forming a metal clad laminate by means of preparing a laminated sheet by piling a particular number of the prepregs and placing a metal foil additionally on at least one outermost layer and heat press-molding the laminated sheet under, forming holes for through holes in the clad laminate obtained for example by drilling, forming through holes by plating the holes, and forming a particular circuit pattern on the metal clad laminate surface by etching the metal foil thereon.

The multilayer printed wiring board is obtained by using such a printed wiring board and a prepreg. Specifically, a multilayer printed wiring board is obtained by placing a particular number of prepregs on one or both faces of the printed wiring board and additionally a metal foil on the outermost layers and heat press-molding the laminate.

Holes are formed in the multilayer printed wiring board; throughholes are formed by plating the holes; and a multilayer printed wiring board having a circuit on the outermost surfaces is prepared by forming a circuit pattern on the metal foil on the metal clad laminate surface by etching.

Dicyandiamide-based curing agents have been used widely as the curing agent for the epoxy resins used in preparing such a prepreg. However, unfavorably, epoxy resins cured by using such a dicyandiamide-based curing agent were less heat resistant and thus, the resulting printed wiring boards were lower in heat resistance.

It is known to use a phenolic curing agent such as cresol novolak resin, phenolic novolak resin, or bisphenol A-based epoxy resin as the curing agent for epoxy resin for improvement of the heat resistance of printed wiring boards (see, e.g., Patent Document 1).

However, epoxy resin compositions containing a phenolic curing agent as the curing agent for epoxy resin had a problem of low moldability, compared to epoxy resin compositions containing a dicyandiamide-based curing agent from the following reasons:

Specifically, it is difficult to keep the board thickness constant, because the resin components contained in the prepreg prepared by using a phenolic curing agent as the curing agent epoxy resin is too low in viscosity. It is also difficult to adjust the timing of pressurization during curing, because the resin becomes very viscous, giving a gel by three-dimensional crosslinking, at a particular time point. As a result, there was a problem that the range of the moldable curing (gel time) is narrow (the range of favorable molding condition is limited).

An epoxy resin composition for printed wiring board containing an imidazole-silane compound, prepared by using a phenolic curing agent containing a bifunctional or lower phenolic curing agent in an amount of 20 to 50% is known as a method of improving the moldability of the phenolic curing agent-containing prepregs (see e.g., Patent Document 2).

However, although the prepreg obtained by using the epoxy resin composition for printed wiring board described in Patent Document 2 was improved in moldability, the adhesiveness between prepregs and also between the prepreg and circuit formed for example with copper foil was insufficient, unfavorably.

Patent Document 1: Japanese Unexamined Patent Publication No. 8-151507
Patent Document 2: Japanese Unexamined Patent Publication No. 2004-115634

SUMMARY OF THE INVENTION

An aspect of the present invention is an epoxy resin composition for printed wiring board, characterize by containing (A) an epoxy resin component containing an epoxy resin (A-1) having nitrogen and bromine atoms in the same molecule, (B) a phenolic curing agent component containing a phenol resin (B-1), and (C) a curing accelerator component containing an imidazole-silane compound (C-1).

Another aspect of the present invention is an epoxy resin composition varnish for printed wiring board, characterized by being produced by dissolving or dispersing the epoxy resin composition for printed wiring board in a solvent containing cyclohexanone in an amount of 20 mass % or more.

Yet another aspect of the present invention is a prepreg, characterized by being produced by impregnating a prepreg-forming substrate with the epoxy resin composition varnish for printed wiring board and drying the resulting substrate.

Yet another aspect of the present invention is a metal clad laminate for printed wiring board, characterized by being produced by laminating a particular number of the prepregs and a metal foil additionally on at least one outermost layer and heat pressure-molding the formed prepreg laminate sheet.

Yet another aspect of the present invention is a printed wiring board, characterized by being produced by forming a particular circuit pattern on the surface metal foil on the metal clad laminate by partially removing the surface metal foil.

Yet another aspect of the present invention is a multilayer printed wiring board, characterized by being produced by heat pressure-molding a multilayer laminate sheet including the prepregs and/or the prepregs containing the printed wiring board and printed wiring boards.

The object, characteristics, aspects, and advantages of the present invention will become more evident in the following detailed description.

DESCRIPTION OF THE PREFERRED EMBODIMENTS

Hereinafter, favorable embodiments of the present invention will be described.

The epoxy resin composition for printed wiring board in the present embodiment is characterized by including (A) an epoxy resin component containing an epoxy resin (A-1) having nitrogen and bromine atoms in the same molecule, (B) a phenolic curing agent component containing a phenol resin (B-1), and (C) a curing accelerator component containing an imidazole-silane compound (C-1).

The epoxy resin component (A) contains the epoxy resin (A-1) having nitrogen and bromine atoms in the same molecule. Such an epoxy resin (A-1) is relatively higher in polarity because it contains nitrogen and bromine atoms, and thus superior in adhesiveness to substrates such as glass cloth and metal foils. It also shows higher adhesiveness, if used in combination with an imidazole-silane compound (C-1) described below.

Typical examples of the epoxy resins (A-1) having nitrogen and bromine atoms in the same molecule include epoxy resin represented by the following General Formula (1) having oxazolidone rings and bromine atoms in the same molecule.

[Formula 1]

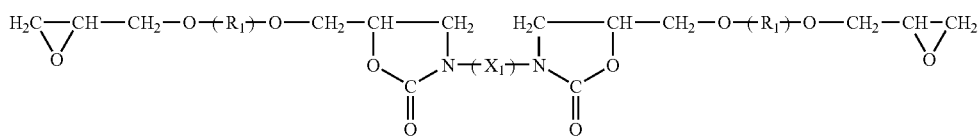

(in Formula (1), $R_1$ represents a bivalent hydrocarbon group having bromine atoms and aromatic rings, and $X_1$ represents a bivalent hydrocarbon group or the derivative group thereof).

The bromine atom content in the epoxy resin (A-1) is preferably 10 to 20 mass % for preservation of sufficient flame resistance.

Alternatively, the epoxy equivalence of the epoxy resin (A-1) is preferably, approximately 230 to 370 g/eq.

The number of epoxy groups in 1 mole of the epoxy resin (A-1) is preferably 1.9 to 2.8, for improvement of the toughness of the resulting prepreg and the adhesiveness described above.

Typical examples of the epoxy resins (A-1) include "AER4100" and "AER5200" manufactured by Asahi Kasei Chemicals Corp., "DER593" manufactured by Dow Chemical Company, and the like that have oxazolidone rings and bromine atoms in the same molecule, The epoxy resin component (A) may contain an epoxy resin other than the epoxy resin (A-1) above.

Typical examples of the epoxy resins other than the epoxy resin (A-1) include epoxy resins such as brominated bisphenol A-type epoxy resins, cresol novolak-type epoxy resins, bisphenol F-type epoxy resins, phenolic novolak-type epoxy resins and dicyclopentadiene-type epoxy resins. These resins may be used alone or in combination of two or more.

The content of the epoxy resin (A-1) in the epoxy resin component (A) is preferably 20 to 80 mass %, more preferably 40 to 80 mass %. The blending ratio above is favorable, because it give an product particularly superior in heat resistance and adhesiveness.

The content of the epoxy resin component (A) is preferably 20 to 90 mass %, more preferably 40 to 80 mass %, in the total amount of the epoxy resin composition.

The epoxy resin composition in the present embodiment contains a phenolic curing agent component (B) as the curing agent of epoxy resin component (A). Use of a phenolic curing agent component (B) as the curing agent of epoxy resin (A) enables improvement in heat resistance larger than use of an amine-based curing agent such as dicyandiamide-based curing agent.

The phenolic curing agent component (B) includes a phenol resin (B-1).

Typical examples of the phenol resins (B-1) include phenolic novolak resins, bisphenol A novolak resins, cresol novolak resins, tetrabromobisphenol A novolak resins, and the like.

The phenolic curing agent component (B) preferably contains a bifunctional or lower phenolic curing agent, in addition to the phenol resin (B-1). Typical examples of the bifunctional or lower phenolic curing agents include bisphenol A, phenol, tetrabromobisphenol A, and the like, as well as the derivatives thereof. The phenolic curing agent component (B), if it contains a bifunctional or lower phenolic curing agent, improves the moldability of the resulting prepreg.

The content of the bifunctional or lower phenolic curing agent is preferably 20 to 50 mass % in the total amount of the phenolic curing agent component (B). If the content is the range above, the curing agent composition provides a wider range of gel time suitable for molding and thus improves molding efficiency.

The phenolic curing agent component (B) preferably contains the phenolic curing agent component (B) in an amount of 0.6 to 1.3 phenolic hydroxyl group equivalences to 1 epoxy group equivalence of the epoxy resin contained in the epoxy resin component (A).

The epoxy resin composition in the present embodiment contains (C) a curing accelerator component containing an imidazole-silane compound (C-1) as the accelerator of the epoxy resin component (A). It is possible to obtain a prepreg superior in adhesiveness, by using such an imidazole-silane compound (C-1) and the epoxy resin (A-1) in combination.

The imidazole-silane compound (C-1) is a compound having both imidazole and alkoxysilyl groups in the molecule.

The content of the imidazole-silane compound (C-1) is preferably 0.05 to 2 mass % in the total amount of the epoxy resin component (A), the phenolic curing agent component (B) and the curing accelerator component (C). The imidazole-silane compound (C-1), if contained in the range above, gives a prepreg superior both in heat resistance and adhesiveness.

The imidazole-silane compound (C-1) is preferably a trialkoxysilyl-type imidazole silane not containing a secondary hydroxyl group, represented by the following General Formula (2), especially for improvement in compatibility of the resin component and consequently for uniform impregnation of the resin composition varnish during production of prepreg.

[Formula 2]

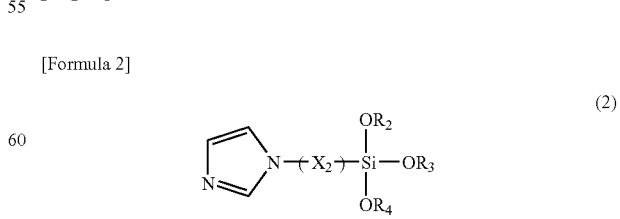

(in Formula (2), $R_2$ to $R_4$ each independently represent an alkyl group such as methyl, ethyl or propyl, and $X_2$ represents a bivalent hydrocarbon group such as linear alkylene).

The epoxy resin composition in the present embodiment preferably contains an inorganic filler (D) additionally.

The inorganic filler is, for example, a known inorganic filler traditionally blended in epoxy resin compositions, and examples thereof include spherical silica, aluminum hydroxide and the like. Among these fillers, aluminum hydroxide is particularly favorable, because drill abrasion is lower when holes are formed in the produced printed wiring board by drilling, and that having an average diameter of 5 to 2 □m is more preferable, for sufficient reduction of the thermal expansion coefficient. Spherical inorganic fillers such as spherical silica, particularly those having an average diameter of 2.0 to 0.3 □m, are also preferable, for sufficient reduction of thermal expansion coefficient and preservation of superior moldability.

The content of the inorganic filler is preferably 5 to 120 parts by mass with respect to 100 parts by mass of the total of the epoxy resin component (A), the phenolic curing agent component (B), the curing accelerator component (C) and the inorganic filler (D), for preservation of superior moldability and sufficient reduction of thermal expansion coefficient.

The epoxy resin composition in the present embodiment can be prepared by blending the various components and agitating the mixture uniformly, for example, in a mixer or blender.

An epoxy resin composition varnish is prepared by dissolving or dispersing the obtained epoxy resin composition in a solvent.

Examples of the solvents include methylethylketone, methoxypropanol, cyclohexanone, and the like. These solvents may be used alone or in combination of two or more. Particularly among the solvents above, a solvent containing cyclohexanone in an amount of 20 mass % or more is preferable, because there is less surface irregularity caused by resins on the surface of the prepreg produced, and thus, a surface-smooth prepreg is obtained.

Impregnation of a substrate for prepreg (prepreg-forming substrate) with the resin varnish prepared and subsequent drying of the substrate under heat in a dryer at 150 to 180° C. for 2 to 10 minutes gives a prepreg in the semi-cured state (B stage).

Typical examples of the prepreg-forming substrates include glass fiber cloths such as glass fabric, glass paper and glass mat, and also, Kraft paper, linter paper, natural fiber fabrics, organic fiber fabrics, and the like.

The content of the resin composition in the prepreg is preferably 35 to 80 mass %.

A metal clad laminate is prepared by laminating a particular number of the prepregs thus obtained, placing a metal foil additionally on at least one outermost layer and molding the composite under heat and pressure.

As for the heat pressure-molding condition, the temperature is for example 160 to 180° C., the molding pressure is 1.5 to 4.0 MPa and the molding time is 30 to 120 minutes. Heating and pressurization under such a condition gives a metal clad laminate used for production of printed wiring boards and others.

Examples of the metal foils for use include copper foil, aluminum foil, stainless steel foil, and the like.

A circuit pattern is formed on the surface of the metal clad laminate thus obtained by leaving circuit pattern-forming regions and removing the other regions thereof by a known circuit-forming method, such as etching by subtractive process. In this way, a printed wiring board carrying a circuit on the surface is prepared.

The printed wiring board obtained can be used as an internal-layer circuit board.

A multilayer printed wiring board is prepared by laminating a particular number of the prepreg on one or both sides of the internal-layer circuit board and a metal foil additionally thereon and molding the composite under heat and pressure. A multilayer printed wiring board carrying a circuit on the surface is prepared by forming a circuit pattern on the metal foil of the surface layer of the multilayer printed wiring board, for example, by subtractive process.

The multilayer printed wiring board thus obtained is superior in heat resistance and also in reliability, because the interlayer adhesiveness is higher.

Hereinafter, the present invention will be described in more detail with reference to Examples. It should be understood that the present invention is not restricted at all by these Examples.

EXAMPLES

First, raw materials used in the present Examples are listed below:

(Epoxy resins (A-1) having oxazolidone rings and bromine atoms in the same molecule)

AER4100: product of Asahi Kasei Chemicals Corp., epoxy equivalence: 320 to 380 g/eq, bromine atom content: 16 to 17 mass %, number of epoxy groups in molecule: approximately 2.

AER5200: product of Asahi Kasei Chemicals Corp., epoxy equivalence: 250 to 390 g/eq, bromine atom content: 16 to 17 mass %, number of epoxy groups in molecule: approximately 3

DER593: product of Dow Chemical Company Co., Ltd., epoxy equivalence: 330 to 390 g/eq, bromine atom content: 17 to 18 mass %, number of epoxy groups in molecule: approximately 2

(Other Epoxy Resins)

N690: product of Dainippon Ink and Chemicals, Inc., cresol novolak-type epoxy resin, epoxy equivalence: 190 to 240 g/eq, bromine atom content: 0 mass %, number of epoxy groups in molecule: 4 to 6, resin softening point: approximately 95° C.

Epichlon 1121: product of Dainippon Ink and Chemicals, Inc. brominated bisphenol A-type epoxy resin, epoxy equivalence: 450 to 530 g/eq, bromine atom content: 19 to 22 mass %, number of epoxy groups in molecule: approximately 2, no nitrogen atom contained.

YDB-400: product of Tohto Kasei Co., Ltd., brominated epoxy resin, epoxy equivalence: 400 g/eq, bromine atom content: approximately 48 mass %, number of epoxy groups in molecule: approximately 2, no nitrogen atom contained (Phenolic Curing Agent Component)

TD2090: product of Dainippon Ink and Chemicals, Inc. phenolic novolak resin, hydroxyl group equivalence: 105 g/eq, resin softening point: 120° C.

KH6021: product of Dainippon Ink and Chemicals, Inc. bisphenol A novolak resin, hydroxyl group equivalence: 118 g/eq, resin softening point: 130° C., bifunctional bisphenol A content: 13 mass %

VH4170: product of Dainippon Ink and Chemicals, Inc. bisphenol A novolak resin, hydroxyl group equivalence: 118 g/eq, resin softening point: 105° C., bifunctional bisphenol A content: 25 mass %

(Amine-Based Curing Agent)

Dicyandiamide: reagent grade (hydroxyl group equivalence: 21 g/eq)

(Inorganic Fillers)
Spherical silica: product of Admatechs Corp., "SO-25R", average diameter: 0.5 □m
Aluminum hydroxide: product of Sumitomo Chemical Co., Ltd., "C-303", average diameter: approximately 4 mm
(Accelerators)
IS1000: product of Nikko Materials Co., Ltd., secondary hydroxyl group-containing trialkoxysilyl-type imidazole silane
IM1000: product of Nikko Materials Co., Ltd. secondary hydroxyl group-noncontaining trialkoxysilyl-type imidazole silane
2-Ethyl-4-methylimidazole: reagent grade
(Solvents)
Methylethylketone: boiling point: approximately 60° C., reagent grade Methoxypropanol: boiling point: approximately 120° C., reagent grade Cyclohexanone: boiling point: approximately 160° C., reagent grade.

<Preparation of Resin Varnishes>

Resin varnishes were prepared in the following manner:
Epoxy resin components and a curing agent component in the blending composition shown in Table 1 or 2 were blended and dissolved in a solvent. The mixture was homogenized by stirring in disperser for two hours. Additionally, an accelerator was added to the solvent in the blending composition shown in Table 1 or 2. The mixture was then stirred in disperser for 2 hours, to give a resin varnish. When an inorganic filler was blended, it was added additionally thereto in the blending composition shown in Table 1 or 2, and the mixture was stirred in Disper for 2 hours, to give a resin varnish.

<Preparation of Prepregs>

A glass cloth (product of Nitto Boseki Co., Ltd., "2116 Type Cloth") was impregnated with the resin varnish at room temperature. It was then heated at approximately 130 to 170° C. for removal of the solvent in the varnish, and the resin composition was semi-cured, to give a prepreg. The amount of the resin in the prepreg was adjusted to 100 parts by mass with respect to 100 parts by mass of the glass cloth. The properties of the prepreg obtained were determined by the following evaluation tests.

[Moldability 1]

Four prepregs obtained (340 mm×510 mm) were held and laminated between surface-roughened faces of two copper foils (thickness: 35 □m, JTC foil, product of Nikko Gould Foil Co., Ltd.), to give a prepreg laminate sheet. The prepreg laminate sheet was then molded under heat and pressure, to give a copper foil-laminated sheet for printed wiring board. The heating/pressurization condition then was a mold temperature of 170° C., an applied pressure of 2.94 MPa, and a pressurized period of 90 minutes. During heat pressure molding, the number of the sheets molded on the stage was 20.

The copper foil on the copper foil-laminated sheet obtained was removed by etching. The thickness of the copper foil-laminated sheet after removal of the copper foil was determined at any 9 points on the surface with a micrometer. Presence of voids on the surface was also evaluated by visual observation. The range of the gel time of a void-free prepreg having a difference between maximum and minimum thickness of 0.05 mm or less was determined. A wider range of gel time is considered that the moldability is better.

[Moldability 2]

The internal-layer circuit board used was an internal-layer circuit board (product of Matsushita Electric Works, Ltd., "CR1766": copper foil thickness: 35 □m) having a thickness of 0.2 mm that is blackened and carries an copper foil with a lattice-like pattern formed on both surfaces (circuit width: 1 mm, circuit interval: 2 mm). A prepreg was placed on both surfaces of the internal-layer circuit board and additionally a copper foil thereon, to give a multilayer laminate sheet. The multilayer laminate sheet was molded under heat and pressure, to give a multilayer printed wiring board. The condition of the heat pressure molding was a mold temperature of 170° C., an applied pressure of 2.94 MPa, and a pressurized period of 90 minutes. The number of the molded sheets on the stage during heat pressure molding was 20.

The copper foil on the copper foil-laminated sheet obtained was removed by etching. The thickness of the copper foil-laminated sheet after removal of the copper foil was determined with a micrometer. at any 30 points on the surface where the lattice-like pattern is formed. Presence of voids on the surface was also evaluated by visual observation. The range of the gel time of a void-free prepreg having a difference between maximum and minimum thickness of 0.05 mm or less was determined. A wider range of gel time is considered that the moldability is better.

[Interlayer Adhesive Strength: Adhesion Strength at the Resin Interface]

A glass cloth in the copper foil-laminated sheet obtained in the "moldability 1" test was peeled off, for determination of its 90° peel strength (JIS C6481).

[Copper Foil Adhesive Strength: Adhesion Strength at the Interface Between Copper Foil and Resin]

A copper foil in the copper foil-laminated sheet obtained in the "moldability 1" test was peeled off, for determination of its 90° peel strength (JIS C6481).

[Oven Heat-Resistance Temperature]

A copper foil-laminated sheet having a thickness of approximately 0.4 mm was prepared in a similar manner to the copper foil-laminated sheet obtained in the "moldability 1" test. The copper foil-laminated sheet obtained was heated in an oven set to various temperatures respectively for 60 minutes. The oven heat-resistance temperature is the maximum temperature at which there is no expansion or separation of the copper foil-laminated sheet after heating.

[Thermal Decomposition Temperature]

A resin was separated from a molded copper foil-laminated sheet and analyzed in a thermogravimetric and differential thermal analyzer (TG-DTA). The programmed heating rate was 5° C./minute. The thermal decomposition temperature was a temperature at which the weight of the sample decreased by 5% from the initial weight.

[Glass Transition Temperature]

The glass transition temperature (Tg) of a multilayer printed wiring board obtained was determined by the TMA method (thermo-mechanical analysis) specified in JIS C6481.

[Thermal Expansion Coefficient (CTE)]

The thermal expansion coefficient in the board thickness direction of a multilayer printed wiring board obtained was determined at a temperature of Tg or lower by the TMA method (thermo-mechanical analysis) specified in JIS C6481.

[Prepreg Surface Irregularity by Resin: Resin Smoothness]

The surface of each prepreg obtained was observed visually, for evaluation of the surface smoothness and the resin deposition unevenness. A prepreg with favorable surface smoothness was designated as "good", while that with more uneven surface, "bad".

[Drill Abrasion Resistance]

A copper foil-laminated sheet having a thickness of approximately 0.4 mm was prepared in a similar manner to the copper foil-laminated sheet obtained in the "moldability 1" test. Five copper foil-laminated sheet obtained were laminated and used for 3000-hit drill processing with a drill, and the abrasion wear of the drill was examined.

As for the criteria for evaluation of the drill abrasion wear, when the initial blade area at the edge of the drill is expressed as 100%, an abraded blade area after 3000-hit drill processing of less than 40% was judged "good", that of less than 50% and 40% or more, "normal", and that of 50% or more, "bad".

[Flame Resistance]

The flame resistance of a molded laminated sheet was evaluated by the method specified in UL Standard.

[Varnish Transparency]

The transparency of a varnish was evaluated by visual observation. A highly transparent varnish was judged "good", a slightly opaque varnish as "normal", and an opaque varnish, as "bad".

Test results of the test items above are summarized in Tables 1 to 3.

TABLE 1

| | | | EXAMPLE | | | | |
|---|---|---|---|---|---|---|---|
| | | | 1 | 2 | 3 | 4 | 5 |
| BLENDING COMPOSITION (PARTS BY MASS) | EPOXY RESIN COMPONENT (A) | AER4100 (A-1) | 80 | 65 | 65 | 65 | 40 |
| | | AER5200 (A-1) | 0 | 0 | 0 | 0 | 0 |
| | | DER593 (A-1) | 0 | 0 | 0 | 0 | 0 |
| | | N690 | 20 | 25 | 25 | 25 | 40 |
| | | EPICHLON 1121 | 0 | 0 | 0 | 0 | 0 |
| | | YDB400 | 0 | 10 | 10 | 10 | 20 |
| | PHENOLIC CURING AGENT COMPONENT (B) | TD2090 | 0 | 0 | 0 | 0 | 0 |
| | | KH6021 | 38 | 38 | 38 | 38 | 41 |
| | | VH4170 | 0 | 0 | 0 | 0 | 0 |
| | OTHER CURING AGENT COMPONENT | DICYANDIAMIDE | 0 | 0 | 0 | 0 | 0 |
| | INORGANIC FILLER (D) | SPHERICAL SILICA | 0 | 0 | 0 | 0 | 0 |
| | | ALUMINUM HYDROXIDE | 0 | 0 | 0 | 0 | 0 |
| | SOLVENT | METHYLETHYLKETONE | 50 | 50 | 30 | 30 | 30 |
| | | METHOXYPROPANOL | 50 | 50 | 30 | 0 | 30 |
| | | CYCLOHEXANONE | 10 | 10 | 40 | 70 | 40 |
| | CURING ACCELERATOR (C) | IS1000 (C-1) | 0.4 | 0.4 | 0.4 | 0.4 | 0.4 |
| | | IM1000 (C-1) | 0 | 0 | 0 | 0 | 0 |
| | | 2E4MZ | 0 | 0 | 0 | 0 | 0 |
| | BROMINE ATOM CONTENT | | 9.5 | 11.5 | 11.5 | 11.5 | 11.7 |
| TEST RESULTS | INTERLAYER ADHESIVE STRENGTH | kN/m | 1.4 | 1.3 | 1.3 | 1.3 | 1.2 |
| | COPPER FOIL ADHESIVE STRENGTH | kN/m | 1.6 | 1.5 | 1.5 | 1.5 | 1.5 |
| | OVEN HEAT-RESISTANCE TEMPERATURE | °C. | 250 | 260 | 260 | 260 | 270 |
| | THERMAL DECOMPOSITION TEMPERATURE | °C. | 325 | 332 | 332 | 332 | 344 |
| | GLASS TRANSITION TEMPERATURE | °C. | 158 | 150 | 150 | 150 | 163 |
| | THERMAL EXPANSION COEFFICIENT (CTE) | ppm/°C. | 60 | 60 | 60 | 60 | 60 |
| | MOLDABILITY EVALUATION 1 | SECOND | 90-170 | 70-110 | 70-110 | 70-110 | 70-110 |
| | MOLDABILITY EVALUATION 2 | SECOND | 90-170 | 60-90 | 60-90 | 60-90 | 60-90 |
| | PREPREG SURFACE IRREGULARITY BY RESIN | — | BAD | BAD | GOOD | GOOD | GOOD |
| | DRILL ABRASION WEAR | — | GOOD | GOOD | GOOD | GOOD | GOOD |
| | VARNISH TRANSPARENCY | — | NORMAL | NORMAL | NORMAL | NORMAL | NORMAL |
| | FLAME RESISTANCE | UL94 | V-1 | V-0 | V-0 | V-0 | V-0 |

| | | | EXAMPLE | | | | |
|---|---|---|---|---|---|---|---|
| | | | 6 | 7 | 8 | 9 | 10 |
| BLENDING COMPOSITION (PARTS BY MASS) | EPOXY RESIN COMPONENT (A) | AER4100 (A-1) | 0 | 0 | 0 | 0 | 0 |
| | | AER5200 (A-1) | 0 | 0 | 0 | 0 | 0 |
| | | DER593 (A-1) | 40 | 40 | 40 | 40 | 40 |
| | | N690 | 40 | 40 | 40 | 40 | 40 |
| | | EPICHLON 1121 | 0 | 0 | 0 | 0 | 0 |
| | | YDB400 | 20 | 20 | 20 | 20 | 20 |
| | PHENOLIC CURING AGENT COMPONENT (B) | TD2090 | 0 | 36 | 0 | 0 | 0 |
| | | KH6021 | 41 | 0 | 0 | 0 | 0 |
| | | VH4170 | 0 | 0 | 41 | 41 | 41 |
| | OTHER CURING AGENT COMPONENT | DICYANDIAMIDE | 0 | 0 | 0 | 0 | 0 |
| | INORGANIC FILLER (D) | SPHERICAL SILICA | 0 | 0 | 0 | 0 | 0 |
| | | ALUMINUM HYDROXIDE | 0 | 0 | 0 | 0 | 0 |

TABLE 1-continued

|  |  |  |  |  |  |  |  |
|---|---|---|---|---|---|---|---|
|  | SOLVENT | METHYLETHYLKETONE | 30 | 30 | 30 | 30 | 30 |
|  |  | METHOXYPROPANOL | 30 | 30 | 30 | 30 | 30 |
|  |  | CYCLOHEXANONE | 40 | 40 | 40 | 40 | 40 |
|  | CURING ACCELERATOR (C) | IS1000 (C-1) | 0.4 | 0.4 | 0.4 | 0 | 0 |
|  |  | M1000 (C-1) | 0 | 0 | 0 | 0.4 | 0.1 |
|  |  | E4MZ | 0 | 0 | 0 | 0 | 0.05 |
|  | BROMINE ATOM CONTENT |  | 12.1 | 12.1 | 12.1 | 12.1 | 12.1 |
| TEST RESULTS | INTERLAYER ADHESIVE STRENGTH | kN/m | 1.2 | 1.2 | 1.3 | 1.3 | 1.1 |
|  | COPPER FOIL ADHESIVE STRENGTH | kN/m | 1.5 | 1.5 | 1.5 | 1.5 | 1.3 |
|  | OVEN HEAT-RESISTANCE TEMPERATURE | °C. | 270 | 270 | 270 | 270 | 270 |
|  | THERMAL DECOMPOSITION TEMPERATURE | °C. | 344 | 344 | 344 | 344 | 344 |
|  | GLASS TRANSITION TEMPERATURE | °C. | 170 | 170 | 170 | 170 | 170 |
|  | THERMAL EXPANSION COEFFICIENT (CTE) | ppm/°C. | 60 | 60 | 60 | 60 | 60 |
|  | MOLDABILITY EVALUATION 1 | SECOND | 70-110 | 70-110 | 100-180 | 100-180 | 100-180 |
|  | MOLDABILITY EVALUATION 2 | SECOND | 60-90 | 60-90 | 100-180 | 100-180 | 100-180 |
|  | PREPREG SURFACE IRREGULARITY BY RESIN | — | GOOD | GOOD | GOOD | GOOD | GOOD |
|  | DRILL ABRASION WEAR | — | GOOD | GOOD | GOOD | GOOD | GOOD |
|  | VARNISH TRANSPARENCY | — | NORMAL | NORMAL | NORMAL | GOOD | GOOD |
|  | FLAME RESISTANCE | UL94 | V-0 | V-0 | V-0 | V-0 | V-0 |

TABLE 2

|  |  |  | EXAMPLE |  |  |  |  |  |
|---|---|---|---|---|---|---|---|---|
|  |  |  | 11 | 12 | 13 | 14 | 15 | 16 |
| BLENDING COMPOSITION (PARTS BY MASS) | EPOXY RESIN COMPONENT (A) | AER4100 (A-1) | 0 | 0 | 0 | 0 | 0 | 0 |
|  |  | AER5200 (A-1) | 0 | 0 | 0 | 0 | 0 | 0 |
|  |  | DER593 (A-1) | 40 | 40 | 40 | 40 | 40 | 40 |
|  |  | N690 | 40 | 40 | 40 | 40 | 40 | 40 |
|  |  | EPICHLON 1121 | 0 | 0 | 0 | 0 | 0 | 0 |
|  |  | YDB400 | 20 | 20 | 20 | 20 | 20 | 20 |
|  | PHENOLIC CURING AGENT | TD2090 | 0 | 0 | 0 | 0 | 0 | 0 |
|  |  | KH6021 | 0 | 0 | 0 | 0 | 0 | 0 |
|  | COMPONENT (B) | VH4170 | 41 | 41 | 41 | 41 | 41 | 41 |
|  | OTHER CURING AGENT COMPONENT | DICYANDIAMIDE | 0 | 0 | 0 | 0 | 0 | 0 |
|  | INORGANIC FILLER (D) | SPHERICAL SILICA | 0 | 0 | 0 | 30 | 0 | 90 |
|  |  | ALUMINUM HYDROXIDE | 0 | 0 | 0 | 0 | 30 | 0 |
|  | SOLVENT | METHYLETHYLKETONE | 30 | 30 | 30 | 30 | 30 | 30 |
|  |  | METHOXYPROPANOL | 30 | 30 | 30 | 30 | 30 | 30 |
|  |  | CYCLOHEXANONE | 40 | 40 | 40 | 40 | 40 | 40 |
|  | CURING ACCELERATOR (C) | IS1000 (C-1) | 0 | 0 | 0 | 0 | 0 | 0 |
|  |  | IM1000 (C-1) | 0.3 | 1.0 | 1.6 | 0.4 | 0.4 | 0.4 |
|  |  | 2E4MZ | 0 | 0 | 0 | 0 | 0 | 0 |
|  | BROMINE ATOM CONTENT |  | 12.1 | 12.1 | 12.1 | 12.1 | 12.1 | 12.1 |
| TEST RESULTS | INTERLAYER ADHESIVE STRENGTH | kN/m | 1.2 | 1.5 | 1.5 | 1.2 | 1.2 | 1.1 |
|  | COPPER FOIL ADHESIVE STRENGTH | kN/m | 1.4 | 1.6 | 1.6 | 1.3 | 1.3 | 1.2 |
|  | OVEN HEAT-RESISTANCE TEMPERATURE | °C. | 270 | 265 | 260 | 270 | 265 | 270 |
|  | THERMAL DECOMPOSITION TEMPERATURE | °C. | 344 | 336 | 332 | 344 | 337 | 344 |
|  | GLASS TRANSITION TEMPERATURE | °C. | 170 | 170 | 170 | 170 | 170 | 170 |
|  | THERMAL EXPANSION COEFFICIENT (CTE) | ppm/°C. | 60 | 60 | 60 | 45 | 45 | 30 |
|  | MOLDABILITY EVALUATION 1 | SECOND | 100-180 | 80-160 | 100-180 | 100-180 | 100-180 | 100-180 |
|  | MOLDABILITY EVALUATION 2 | SECOND | 100-180 | 80-140 | 100-180 | 100-180 | 100-180 | 90-170 |

TABLE 2-continued

|  |  |  |  |  |  |  |  |  |
|---|---|---|---|---|---|---|---|---|
|  | PREPREG SURFACE IRREGULARITY BY RESIN | — |  | GOOD | GOOD | GOOD | GOOD | GOOD | GOOD |
|  | DRILL ABRASION WEAR | — |  | GOOD | GOOD | GOOD | NORMAL | GOOD | BAD |
|  | VARNISH TRANSPARENCY | — |  | GOOD | GOOD | GOOD | BAD | BAD | BAD |
|  | FLAME RESISTANCE | UL94 |  | V-0 | V-0 | V-0 | V-0 | V-0 | V-0 |

|  |  |  | EXAMPLE | | | | |
|---|---|---|---|---|---|---|---|
|  |  |  | 17 | 18 | 19 | 20 | 21 |
| BLENDING COMPOSITION (PARTS BY MASS) | EPOXY RESIN COMPONENT (A) | AER4100 (A-1) | 0 | 0 | 0 | 0 | 0 |
|  |  | AER5200 (A-1) | 0 | 0 | 0 | 40 | 0 |
|  |  | DER593 (A-1) | 40 | 40 | 20 | 0 | 20 |
|  |  | N690 | 40 | 40 | 30 | 40 | 50 |
|  |  | EPICHLON 1121 | 0 | 0 | 30 | 0 | 0 |
|  |  | YDB400 | 20 | 20 | 20 | 20 | 30 |
|  | PHENOLIC CURING AGENT COMPONENT (B) | TD2090 | 0 | 0 | 0 | 0 | 0 |
|  |  | KH6021 | 0 | 0 | 0 | 45 | 0 |
|  |  | VH4170 | 41 | 41 | 36 | 0 | 42 |
|  | OTHER CURING AGENT COMPONENT | DICYANDIAMIDE | 0 | 0 | 0 | 0 | 0 |
|  | INORGANIC FILLER (D) | SPHERICAL SILICA | 0 | 60 | 0 | 0 | 0 |
|  |  | ALUMINUM HYDROXIDE | 90 | 30 | 0 | 0 | 0 |
|  | SOLVENT | METHYLETHYLKETONE | 30 | 30 | 30 | 30 | 30 |
|  |  | METHOXYPROPANOL | 30 | 30 | 30 | 30 | 30 |
|  |  | CYCLOHEXANONE | 40 | 40 | 40 | 40 | 40 |
|  | CURING ACCELERATOR (C) | IS1000 (C-1) | 0 | 0 | 0 | 0.4 | 0 |
|  |  | IM1000 (C-1) | 0.4 | 0.4 | 0.4 | 0 | 0.4 |
|  |  | 2E4MZ | 0 | 0 | 0 | 0 | 0 |
|  | BROMINE ATOM CONTENT |  | 12.1 | 12.1 | 19.3 | 11.7 | 13.1 |
| TEST RESULTS | INTERLAYER ADHESIVE STRENGTH | kN/m | 1.2 | 1.1 | 1.2 | 1.0 | 1.2 |
|  | COPPER FOIL ADHESIVE STRENGTH | kN/m | 1.3 | 1.2 | 1.4 | 1.3 | 1.4 |
|  | OVEN HEAT-RESISTANCE TEMPERATURE | °C. | 260 | 265 | 280 | 260 | 273 |
|  | THERMAL DECOMPOSITION TEMPERATURE | °C. | 331 | 337 | 354 | 338 | 347 |
|  | GLASS TRANSITION TEMPERATURE | °C. | 170 | 170 | 140 | 172 | 170 |
|  | THERMAL EXPANSION COEFFICIENT (CTE) | ppm/°C. | 30 | 30 | 60 | 60 | 60 |
|  | MOLDABILITY EVALUATION 1 | SECOND | 80-120 | 100-180 | 100-180 | 70-100 | 100-180 |
|  | MOLDABILITY EVALUATION 2 | SECOND | 70-110 | 100-180 | 100-180 | 60-80 | 100-180 |
|  | PREPREG SURFACE IRREGULARITY BY RESIN | — | GOOD | GOOD | GOOD | GOOD | GOOD |
|  | DRILL ABRASION WEAR | — | NORMAL | NORMAL | GOOD | GOOD | GOOD |
|  | VARNISH TRANSPARENCY | — | BAD | BAD | BAD | NORMAL | GOOD |
|  | FLAME RESISTANCE | UL94 | V-0 | V-0 | V-0 | V-0 | V-0 |

TABLE 3

|  |  |  | COMPARATIVE EXAMPLE | | | | |
|---|---|---|---|---|---|---|---|
|  |  |  | 1 | 2 | 3 | 4 | 5 |
| BLENDING COMPOSITION (PARTS BY MASS) | EPOXY RESIN COMPONENT (A) | AER4100 (A-1) | 0 | 0 | 0 | 0 | 0 |
|  |  | DER593 (A-1) | 0 | 0 | 0 | 0 | 0 |
|  |  | N690 | 40 | 40 | 40 | 40 | 40 |
|  |  | EPICHLON 1121 | 50 | 50 | 50 | 50 | 50 |
|  |  | YDB400 | 10 | 10 | 10 | 10 | 10 |
|  | PHENOLIC CURING AGENT COMPONENT (B) | TD2090 | 0 | 32 | 0 | 0 | 0 |
|  |  | KH6021 | 36 | 0 | 36 | 0 | 0 |
|  |  | VH4170 | 0 | 0 | 0 | 36 | 0 |
|  | OTHER CURING AGENT COMPONENT | DICYANDIAMIDE | 0 | 0 | 0 | 0 | 3.2 |
|  | INORGANIC FILLER (D) | SPHERICAL SILICA | 0 | 0 | 0 | 0 | 0 |
|  |  | ALUMINUM HYDROXIDE | 0 | 0 | 0 | 0 | 0 |
|  | SOLVENT | METHYLETHYLKETONE | 30 | 30 | 30 | 30 | 30 |
|  |  | METHOXYPROPANOL | 30 | 30 | 30 | 30 | 30 |
|  |  | CYCLOHEXANONE | 40 | 40 | 40 | 40 | 40 |

TABLE 3-continued

|  |  |  |  |  |  |  |  |
|---|---|---|---|---|---|---|---|
|  | CURING ACCELERATOR (C) | IS1000 (C-1) |  | 0.4 | 0 | 0 | 0 | 0 |
|  |  | IM1000 (C-1) |  | 0 | 0.4 | 0.4 | 0.4 | 0.4 |
|  |  | 2E4MZ |  | 0 | 0 | 0 | 0 | 0 |
|  | BROMINE ATOM CONTENT |  |  | 11.0 | 11.0 | 11.0 | 11.0 | 11.0 |
| TEST RESULTS | INTERLAYER ADHESIVE STRENGTH | kN/m | 0.7 | 0.7 | 0.7 | 0.8 | 1.3 |
|  | COPPER FOIL ADHESIVE STRENGTH | kN/m | 1.1 | 1.0 | 1.1 | 1.1 | 1.4 |
|  | OVEN HEAT-RESISTANCE TEMPERATURE | °C. | 280 | 280 | 280 | 280 | 235 |
|  | THERMAL DECOMPOSITION TEMPERATURE | °C. | 360 | 360 | 360 | 360 | 310 |
|  | GLASS TRANSITION TEMPERATURE | °C. | 164 | 166 | 164 | 158 | 163 |
|  | THERMAL EXPANSION COEFFICIENT (CTE) | ppm/°C. | 60 | 60 | 60 | 60 | 60 |
|  | MOLDABILITY EVALUATION 1 | SECOND | 70-110 | 70-110 | 70-110 | 100-180 | 100-200 |
|  | MOLDABILITY EVALUATION 2 | SECOND | 60-90 | 60-90 | 60-90 | 100-180 | 100-200 |
|  | PREPREG SURFACE IRREGULARITY BY RESIN | — | GOOD | GOOD | GOOD | GOOD | GOOD |
|  | DRILL ABRASION WEAR | — | GOOD | GOOD | GOOD | GOOD | GOOD |
|  | VARNISH TRANSPARENCY | — | NORMAL | GOOD | GOOD | GOOD | GOOD |
|  | FLAME RESISTANCE | UL94 | V-0 | V-0 | V-0 | V-0 | V-0 |

|  |  |  | COMPARATIVE EXAMPLE | | | |
|---|---|---|---|---|---|---|
|  |  |  | 6 | 7 | 8 | 9 |
| BLENDING COMPOSITION (PARTS BY MASS) | EPOXY RESIN COMPONENT (A) | AER4100 (A-1) | 40 | 0 | 0 | 0 |
|  |  | DER593 (A-1) | 0 | 40 | 40 | 40 |
|  |  | N690 | 40 | 40 | 40 | 40 |
|  |  | EPICHLON 1121 | 0 | 0 | 0 | 0 |
|  |  | YDB400 | 20 | 20 | 20 | 20 |
|  | PHENOLIC CURING AGENT COMPONENT (B) | TD2090 | 0 | 0 | 0 | 0 |
|  |  | KH6021 | 0 | 0 | 0 | 0 |
|  |  | VH4170 | 41 | 41 | 0 | 0 |
|  | OTHER CURING AGENT COMPONENT | DICYANDIAMIDE | 0 | 0 | 3.2 | 3.2 |
|  | INORGANIC FILLER (D) | SPHERICAL SILICA | 0 | 0 | 0 | 0 |
|  |  | ALUMINUM HYDROXIDE | 0 | 0 | 0 | 0 |
|  | SOLVENT | METHYLETHYLKETONE | 30 | 30 | 30 | 30 |
|  |  | METHOXYPROPANOL | 30 | 30 | 30 | 30 |
|  |  | CYCLOHEXANONE | 40 | 40 | 40 | 40 |
|  | CURING ACCELERATOR (C) | IS1000 (C-1) | 0 | 0 | 0 | 0 |
|  |  | IM1000 (C-1) | 0 | 0 | 0 | 0.4 |
|  |  | 2E4MZ | 0.06 | 0.06 | 0.06 | 0 |
|  | BROMINE ATOM CONTENT |  | 11.7 | 12.0 | 12.0 | 12.0 |
| TEST RESULTS | INTERLAYER ADHESIVE STRENGTH | kN/m | 0.9 | 0.9 | 1.5 | 1.6 |
|  | COPPER FOIL ADHESIVE STRENGTH | kN/m | 1.2 | 1.2 | 1.6 | 1.6 |
|  | OVEN HEAT-RESISTANCE TEMPERATURE | °C. | 270 | 270 | 230 | 225 |
|  | THERMAL DECOMPOSITION TEMPERATURE | °C. | 345 | 345 | 305 | 300 |
|  | GLASS TRANSITION TEMPERATURE | °C. | 169 | 171 | 172 | 172 |
|  | THERMAL EXPANSION COEFFICIENT (CTE) | ppm/°C. | 60 | 60 | 60 | 60 |
|  | MOLDABILITY EVALUATION 1 | SECOND | 100-180 | 100-180 | 100-200 | 100-200 |
|  | MOLDABILITY EVALUATION 2 | SECOND | 100-180 | 100-180 | 100-200 | 100-200 |
|  | PREPREG SURFACE IRREGULARITY BY RESIN | — | GOOD | GOOD | GOOD | GOOD |
|  | DRILL ABRASION WEAR | — | GOOD | GOOD | GOOD | GOOD |
|  | VARNISH TRANSPARENCY | — | GOOD | GOOD | GOOD | GOOD |
|  | FLAME RESISTANCE | UL94 | V-0 | V-0 | V-0 | V-0 |

The results in Tables 1 and 2 show that the prepregs of Examples 1 to 21 are superior both in adhesiveness and heat resistance.

Specifically, the test results of the interlayer adhesiveness and the copper foil adhesiveness of the prepregs of Examples 1 to 21 were all high at 1.0 kN/m or more, and the oven heat-resistance temperatures thereof are 250° C. or higher.

On the other hand the test results of the prepregs of Comparative Examples 1 to 4, which did not contain the epoxy resin (A-1) having oxazolidone rings and bromine atoms in the same molecule but contains a phenolic curing agent (B) as curing agent and an imidazole-silane compound (C-1) as accelerator, shown in Table 3 show that the oven heat resistances was high at 280° C. and the heat resistance was also high, but the interlayer adhesiveness was low at 0.7 to 0.8 kN/m and also, the adhesiveness was low.

In addition, the prepreg of Comparative Example 5, which did not contain the epoxy resin (A-1) but contained dicyandiamide as curing agent, had a high interlayer adhesiveness of 1.3 kN/m but also a very low oven heat-resistance temperature of 235° C.

Further, the prepregs of Comparative Examples 6 to 7, which contained the epoxy resin (A-1) and a phenol resin as curing agent, but did not contain an imidazole-silane compound (C-1), had a low interlayer adhesiveness of 0.9 kN/m.

Further, the prepregs of Comparative Examples 8 and 9, which contained the epoxy resin (A-1) but not the phenol resin as curing agent, had a low oven heat resistance of 225 to 230° C.

As described above, prepregs superior both in adhesiveness and heat resistance could be obtained in Examples 1 to 21, in which an epoxy resin composition containing the epoxy resin (A-1), the phenol resin (B-1), and imidazole-silane compound (C-1) (C) was used.

As described above in detail, an aspect of the present invention is an epoxy resin composition for printed wiring board, characterized by including (A) an epoxy resin component containing an epoxy resin (A-1) having nitrogen and bromine atoms in the same molecule, (B) a phenolic curing agent component containing a phenol resin (B-1), and (C) a curing accelerator component containing an imidazole-silane compound (C-1). The epoxy resin (A-1) having nitrogen and bromine atoms in the same molecule, which is a resin component relatively higher in polarity, is superior in adhesiveness to substrates such as glass cloth and metal foils. Combined use of the epoxy resin (A-1) and the imidazole-silane compound (C-1) raises the adhesiveness of the prepreg further. It is also possible to preserve favorable heat resistance by using a phenolic curing agent component (B) as curing agent component.

The epoxy resin (A-1) is preferably a resin containing 1.9 to 2.8 epoxy groups in the molecule on average. The epoxy resin having such a number of epoxy groups is effective in improving the toughness and also the adhesiveness of the resulting prepreg.

In addition, the epoxy resin (A-1) is preferably an epoxy resin having oxazolidone rings and bromine atoms in the same molecule. The epoxy resin having oxazolidone rings and bromine atoms in the same molecule is effective in raising the glass transition point (Tg) of the epoxy resin component and thus in improving the heat resistance.

The epoxy resin composition for printed wiring board preferably contains bromine atoms in an amount of 10 mass % or more, with respect to the total amount of the epoxy resin component (A), the phenolic curing agent component (B) and the curing accelerator component (C).

Also in the epoxy resin composition for printed wiring board, the content of the epoxy resin (A-1) in the epoxy resin component (A) is preferably 20 to 80 mass %. Favorably if the content is in the range above, the epoxy resin composition is superior in the balance of adhesiveness and heat resistance.

Preferably in the epoxy resin composition for printed wiring board, the phenol resin (B-1) contains a bisphenol A novolak resin. The bisphenol A novolak resin, if contained in the phenol resin (B-1), improves the toughness and also the adhesiveness of the resulting prepreg.

Also favorably in the epoxy resin composition for printed wiring board, the phenolic curing agent component (B) contains bisphenol A. Presence of bisphenol A improve the moldability further.

Preferably in the epoxy resin composition for printed wiring board, the content of the imidazole-silane compound (C-1) is preferably 0.05 to 2 mass % in the total amount of the epoxy resin component (A), the phenolic curing agent component (B) and the curing accelerator component (C). The imidazole-silane compound (C-1), if contained in an amount in the range above, allows preservation of the favorable adhesiveness and heat resistance at the same time.

The epoxy resin composition for printed wiring board preferably contains an inorganic filler (D) additionally. Addition of the inorganic filler is effective in giving a prepreg having a lower thermal expansion coefficient and higher heat resistance.

Favorably in the epoxy resin composition for printed wiring board, the inorganic filler (D) contains a spherical inorganic filler. Such a resin give a prepreg superior in moldability and also heat resistance.

Also favorably in the epoxy resin composition for printed wiring board, the inorganic filler (D) contains aluminum hydroxide. The epoxy resin preferably contains aluminum hydroxide as the inorganic filler (D), because abrasion of a drill, when used in drill processing of produced printed wiring board, is lower.

Another aspect of the present invention is an epoxy resin composition varnish for printed wiring board, prepared by dissolving or dispersing the epoxy resin composition for printed wiring board in a solvent containing cyclohexanone in an amount of 20 mass % or more. It is possible to obtain a prepreg resistant to generation of the irregularity on the prepreg surface causes by resin deposition by using a solvent containing cyclohexanone in an amount of 20% or more in preparation of the varnish.

Yet another aspect of the present invention is a prepreg, produced by impregnating a prepreg-forming substrate with the epoxy resin composition varnish for printed wiring board and drying the resulting substrate. Such a prepreg is superior in adhesiveness to substrates such as glass cloth and metal foils and also in heat resistance, and thus the printed wiring board obtained with such a prepreg is higher in reliability.

Yet another aspect of the present invention is a metal clad laminate for printed wiring board, produced by laminating a particular number of the prepregs and a metal foil additionally on at least one outermost layer and heat pressure-molding the formed prepreg laminate sheet. In the metal clad laminate thus obtained, the prepregs and also the prepreg and the metal foil are bonded to each other by large adhesive strength.

Yet another aspect of the present invention is a printed wiring board, produced by forming a particular circuit pattern on the surface metal foil on the metal clad laminate above. Such a printed wiring board is a substrate superior in the adhesiveness and heat resistance and higher in reliability, and used favorably in production of multilayer printed wiring boards.

Yet another aspect of the present invention is a multilayer printed wiring board, produced by heat pressure-molding a multilayer laminate sheet including the prepregs and/or the printed wiring board containing the prepregs and the printed wiring boards. Such a multilayer printed wiring board is superior in heat resistance and also in interlayer adhesiveness and thus, shows high reliability.

What is claimed is:

1. An epoxy resin composition for printed wiring board, comprising:
   (A) an epoxy resin component containing an epoxy resin (A-1) having nitrogen and bromine atoms in the same molecule,
   (B) a phenolic curing agent component containing a phenol resin (B-1), and
   (C) a curing accelerator component containing an imidazole-silane compound (C-1) represented by the following General Formula (2)

[Formula 2]

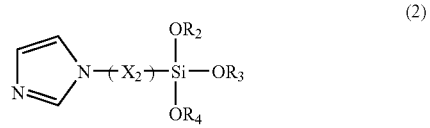

(2)

wherein $R_2$ to $R_4$ each independently represent an alkyl group and $X_2$ represents a bivalent hydrocarbon group.

2. The epoxy resin composition for printed wiring board according to claim 1, wherein the epoxy resin (A-1) has 1.9 to 2.8 epoxy groups on average in the molecule.

3. The epoxy resin composition for printed wiring board according to claim 1, wherein the epoxy resin (A-1) is an epoxy resin having oxazolidone rings and bromine atoms in the same molecule.

4. The epoxy resin composition for printed wiring board according to claim 1, wherein the epoxy resin composition contains bromine atoms in an amount of 10 mass % or more with respect to the total amount of the epoxy resin component (A), the phenolic curing agent component (B) and the curing accelerator component (C).

5. The epoxy resin composition for printed wiring board according to claim 1, wherein the content of the epoxy resin (A-1) is 20 to 80 mass % in the entire amount of the epoxy resin component (A).

6. The epoxy resin composition for printed wiring board according to claim 1, wherein the phenol resin (B-1) contains a bisphenol A novolak resin.

7. The epoxy resin composition for printed wiring board according to claim 1, wherein the phenolic curing agent component (B) contains bisphenol A.

8. The epoxy resin composition for printed wiring board according to claim 1, wherein the content of the imidazole-silane compound (C-1) is 0.05 to 2 mass % in the total amount of the epoxy resin component (A), the phenolic curing agent component (B) and the curing accelerator component (C).

9. The epoxy resin composition for printed wiring board according to claim 1, further containing an inorganic filler (D).

10. The epoxy resin composition for printed wiring board according to claim 9, wherein the inorganic filler (D) contains a spherical inorganic filler.

11. The epoxy resin composition for printed wiring board according to claim 9, wherein the inorganic filler (D) contains aluminum hydroxide.

12. An epoxy resin composition varnish for printed wiring board, which is produced by dissolving or dispersing the epoxy resin composition for printed wiring board according to claim 1 in a solvent containing cyclohexanone in an amount of 20 mass % or more.

13. A prepreg, which is produced by impregnating a prepreg-forming substrate with the epoxy resin composition varnish for printed wiring board according to claim 12 and drying the resulting substrate.

14. A metal clad laminate for printed wiring board, which is produced by laminating a particular number of the prepregs according to claim 13, and a metal foil additionally on at least one outermost layer and heat pressure-molding the formed prepreg laminate sheet.

15. A printed wiring board, which is produced by forming a particular circuit pattern on the surface metal foil on the metal clad laminate according to claim 14.

16. A multilayer printed wiring board, which is produced by heat pressure-molding a multilayer laminate sheet including the prepregs according to claim 13 and/or a printed wiring board produced by forming a particular circuit pattern on a surface metal foil on a metal clad laminate produced by laminating a particular number of the prepregs according to claim 13, and a metal foil additionally on at least one outermost layer and heat pressure-molding the formed prepreg laminate sheet, containing the prepregs and the printed wiring boards.

17. An epoxy resin composition for printed wiring board according to claim 1, wherein $R_2$ to $R_4$ of General Formula (2) each independently represent a methyl, ethyl, or propyl group.

18. An epoxy resin composition for printed wiring board according to claim 1, wherein $X_2$ of General Formula (2) represents a linear alkylene.

19. An epoxy resin composition for printed wiring board according to claim 1, wherein $R_2$ to $R_4$ of General Formula (2) each independently represent a methyl, ethyl, or propyl group and $X_2$ of General Formula (2) represents a linear alkylene.

* * * * *